United States Patent [19]

Iizuka

[11] 4,401,903
[45] Aug. 30, 1983

[54] MOS DECODER CIRCUIT

[75] Inventor: Tetsuya Iizuka, Kawasaki, Japan

[73] Assignee: Tokyo Shibaura Denki Kabushiki Kaisha, Japan

[21] Appl. No.: 183,992

[22] Filed: Sep. 4, 1980

[30] Foreign Application Priority Data

Sep. 13, 1979 [JP] Japan ............................. 54-117747

[51] Int. Cl.³ .................................... H03K 19/094
[52] U.S. Cl. .................................. 307/449; 307/451; 307/463
[58] Field of Search ............... 307/449, 463, DIG. 5

[56] References Cited

U.S. PATENT DOCUMENTS 3,965,369 6/1976 Hatsukano ..................... 307/450
4,063,118 12/1977 Nishimura ..................... 307/449

OTHER PUBLICATIONS

Stewart, *High Density CMOS ROM Arrays*, 1977 IEEE International Solid-State Circuits Conference, pp. 20-21, 230, (Feb. 16, 1977).

Akiya and Ohara, *New Input/Output Designs for High Speed Static CMOS RAM*, IEEE Journal of Solid-State Circuits, vol. SC-14, No. 5, pp. 823-828, (Oct. 1979).

*Primary Examiner*—Stanley D. Miller
*Assistant Examiner*—B. P. Davis
*Attorney, Agent, or Firm*—Finnegan, Henderson, Farabow, Garrett & Dunner

[57] ABSTRACT

An MOS decoder circuit including parallel rows or columns of MOS transistors connected to an input signal to be decoded. Two clocked MOS transistors of a channel type different from that used to form the rows of MOS transistors are connected as load resistances, one being connected to the drains of one row of transistors and the other being connected to an MOS transistor circuit coupled to another row of MOS transistors.

3 Claims, 69 Drawing Figures

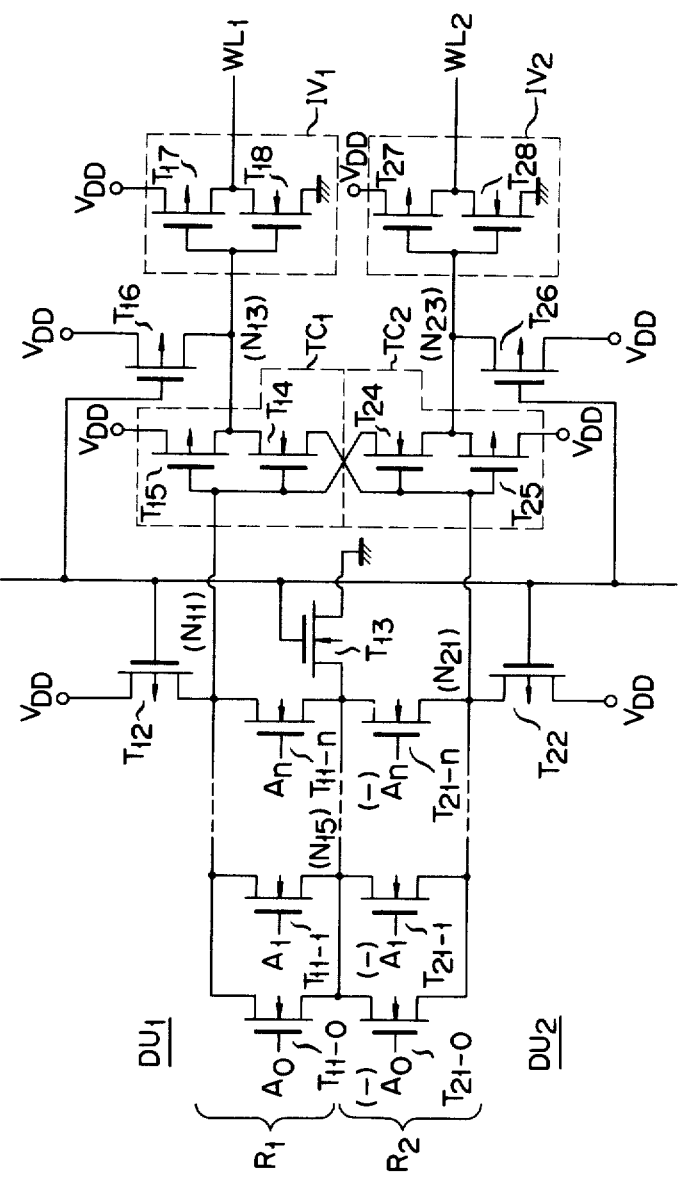
F I G. 2

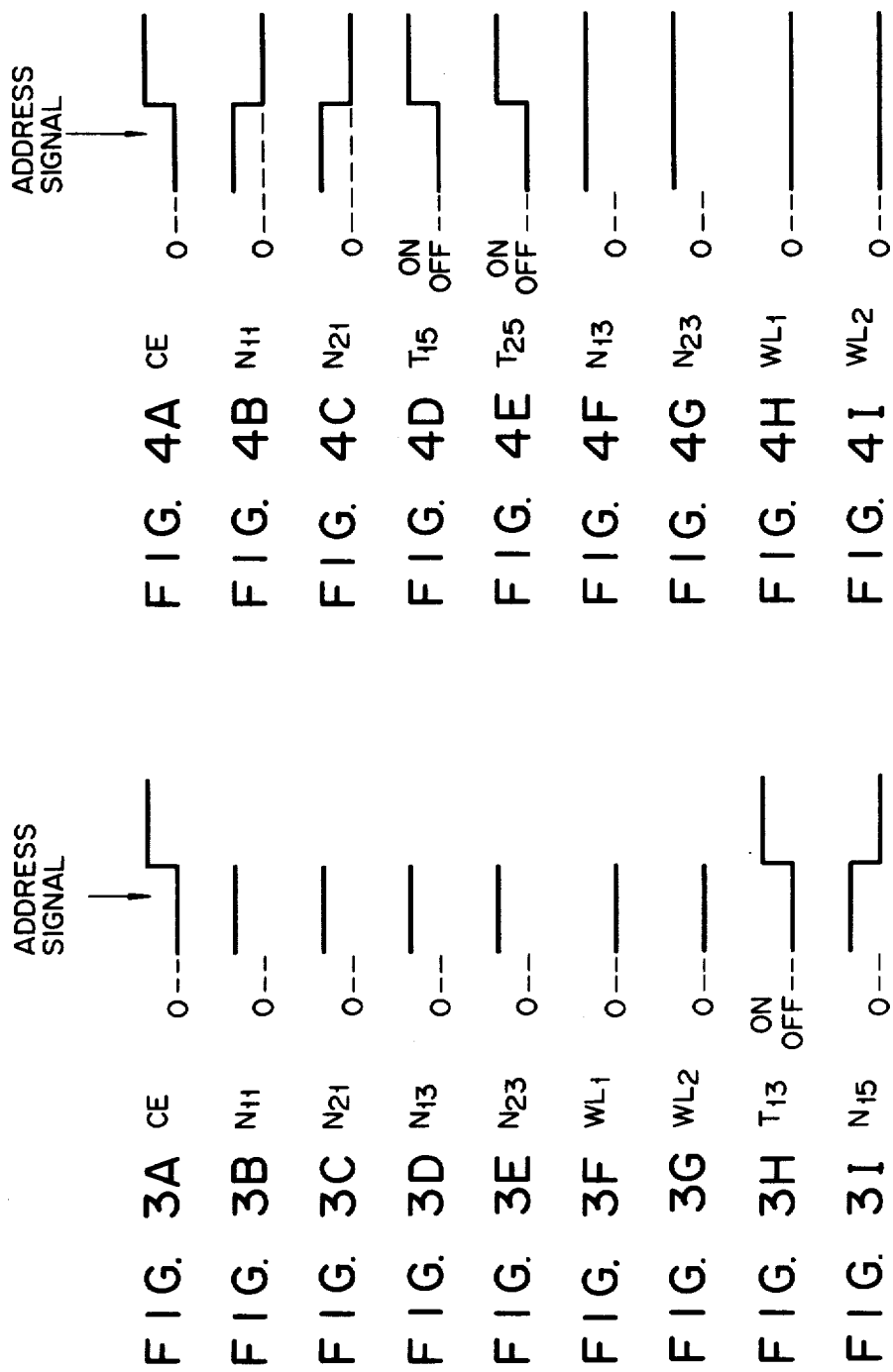

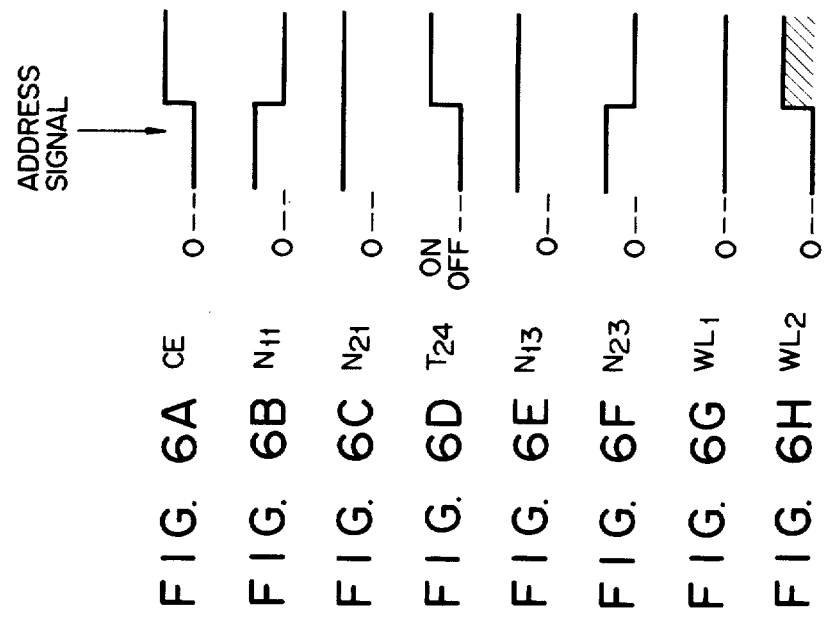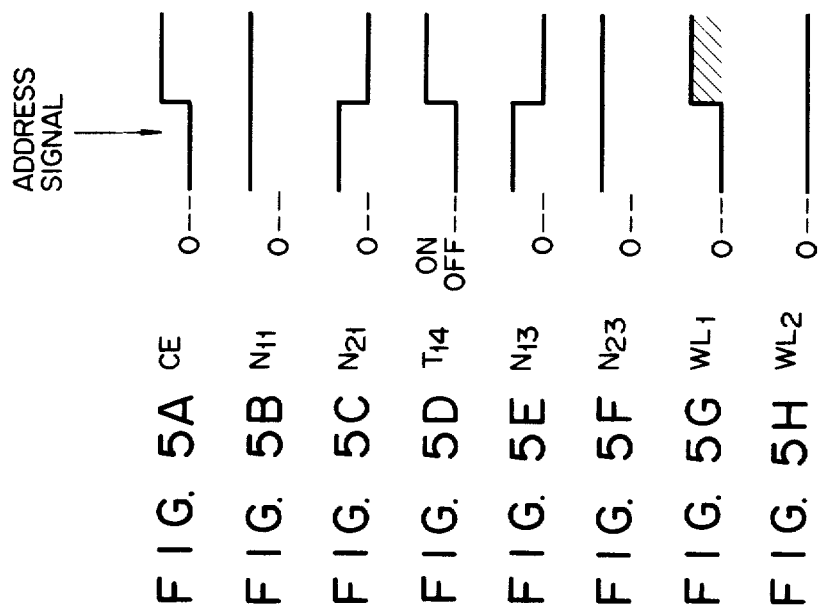

F I G. 9
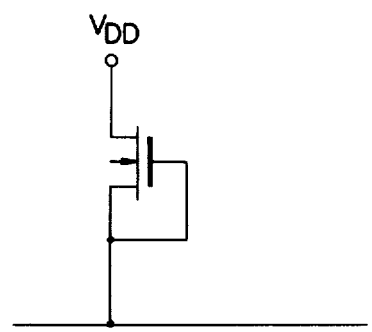
F I G. 10
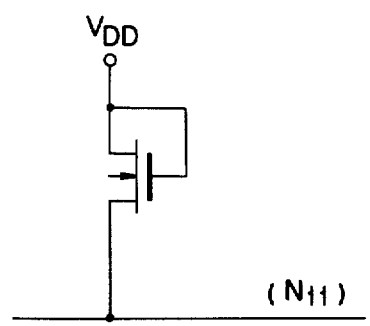

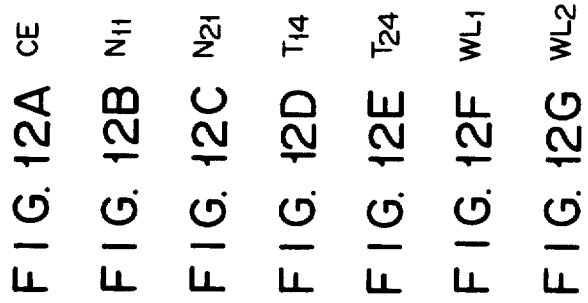
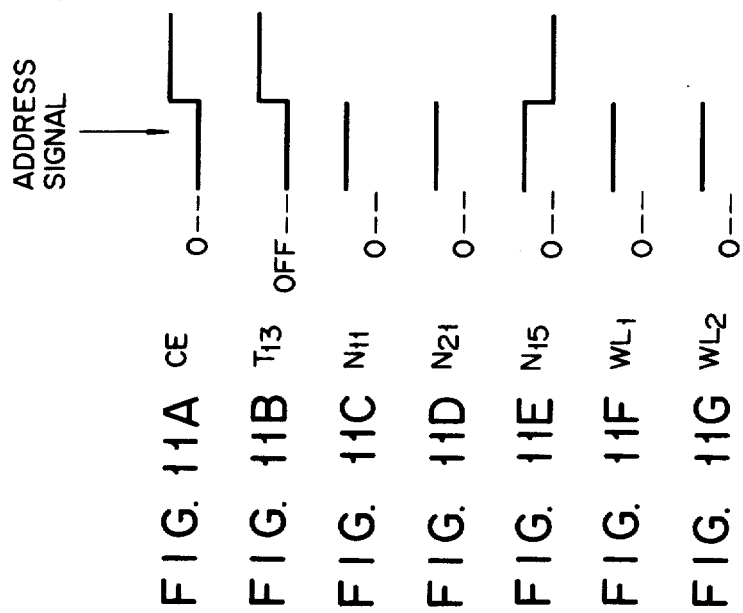

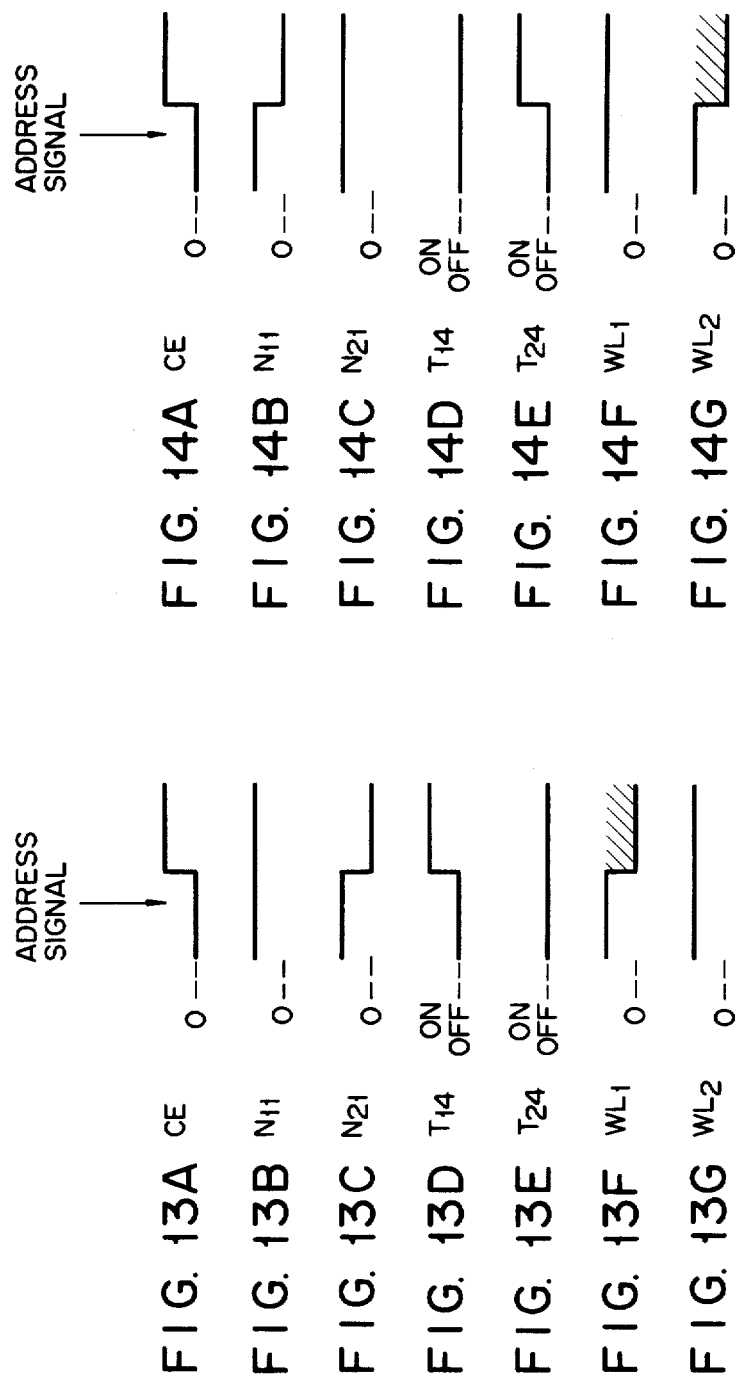

MOS DECODER CIRCUIT

BACKGROUND OF THE INVENTION

This invention relates to MOS (metal oxide semiconductor) decoder device used for synchronous MOS memory devices or the like.

As a decoder device for a synchronous MOS memory device which operates in synchronism to a clock signal, one having a construction as shown in FIG. 1 is well-known in the art. This decoder circuit serves to decode an address signal consisting of address bits $A_0$ to $A_n$ according to two clock signals $CE_1$ and $\overline{CE}_1$, which are 180 degrees out of phase with each other, thereby selecting a word line WL. If the clock signal $\overline{CE}_1$ is at "1" level and the clock signal $CE_1$ is at "0" level, N channel MOS transistors $T_3$ and $T_7$ are turned on so that the potential on a node $N_1$ and a word line WL is at "0" level. After an address signal consisting of address bits $A_0, A_1, \ldots, A_n$ is coupled to P channel transistors $T_{1-0}, T_{1-1}, \ldots, T_{1-n}$, the clock signal $\overline{CE}_1$ is inverted to "0" level to turn a P channel MOS transistor $T_2$ on and turn the N channel MOS transistor $T_3$ off.

If the address bits $A_0$ to $A_n$ are all at "0" level, the node $N_1$ is held at "0" level. On the other hand, if at least one of the address bits $A_0$ to $A_n$ is at "1" level, the potential on the node $N_1$ is changed to "1" level. When the node $N_1$ is at "0" level, a P channel MOS transistor $T_5$ is turned on so that the word line WL is brought to "1" level and thus selected. On the other hand, if the node $N_1$ is at "1" level, an N channel MOS transistor $T_4$ is turned on so that the word line WL remains at "0" level and is thus not selected.

As is seen from the above, the prior-art decoder circuit of FIG. 1 requires two clock signals 180 degrees out of phase with each other. Besides, there is a certain limitation imposed upon the timing of the generation of pulses, and the clock pulse $CE_1$ must be inverted from "0" level to "1" level after the inversion of the preceding clock pulse $\overline{CE}_1$ from "1" level to "0" level. Unless this timing relation between the two clock pulse signals is met, a malfunction such as simultaneous selection of a plurality of word lines is likely to result. This requirement for the clock signals complicates the circuit and imposes restrictions upon the operating speed, thereby creating various problems.

SUMMARY OF THE INVENTION

The invention is intended in the light of the above background, and its object is to provide a MOS decoder circuit for which a simpler clock signal system can be readily designed and a high operating speed can be obtained.

According to the invention there is provided a MOS decoder circuit comprising first MOS transistors of a first channel type arranged in the form of a row or column, said first MOS transistors being connected in parallel to one another and receiving at their gates a to-be-decoded signal, a first load resistor means connected between the drains of said first MOS transistors and a first voltage potential, a second MOS transistor of the first channel type connected between the sources of said first MOS transistors and a second voltage potential and receiving at its gate a clock signal, a MOS transistor circuit including at least one MOS transistor and having an input terminal and first and second output terminals, said input terminal being connected to the drains of said first MOS transistors, said first output terminal being connected to the drains of MOS transistors of the first channel type arranged in a form of row or column adjacent to said row or column constituted by said first MOS transistors, and a second load resistor means connected between said second output terminal of said MOS transistor circuit and the first voltage potential.

BRIEF DESCRIPTION OF THE DRAWINGS

FIG. 2 is a circuit diagram showing an embodiment of the MOS decoder circuit according to the invention;

FIGS. 3A to 3I, 4A to 4I, 5A to 5H and 6A to 6H are timing charts showing waveforms appearing at various portions of the decoder circuit of FIG. 2 for illustration of the operation thereof;

FIG. 9 is a circuit diagram showing an example of the load resistor used in the embodiment of FIG. 8;

FIG. 10 is a circuit diagram showing another example of the load resistor used in the embodiment of FIG. 8;

FIGS. 11A to 11G, 12A to 12G, 13A to 13G and 14A to 14G are timing charts showing waveforms appearing at various portions of the decoder circuit of FIG. 8 for illustration of the operation thereof.

DESCRIPTION OF THE PREFERRED EMBODIMENTS

Figure 1:
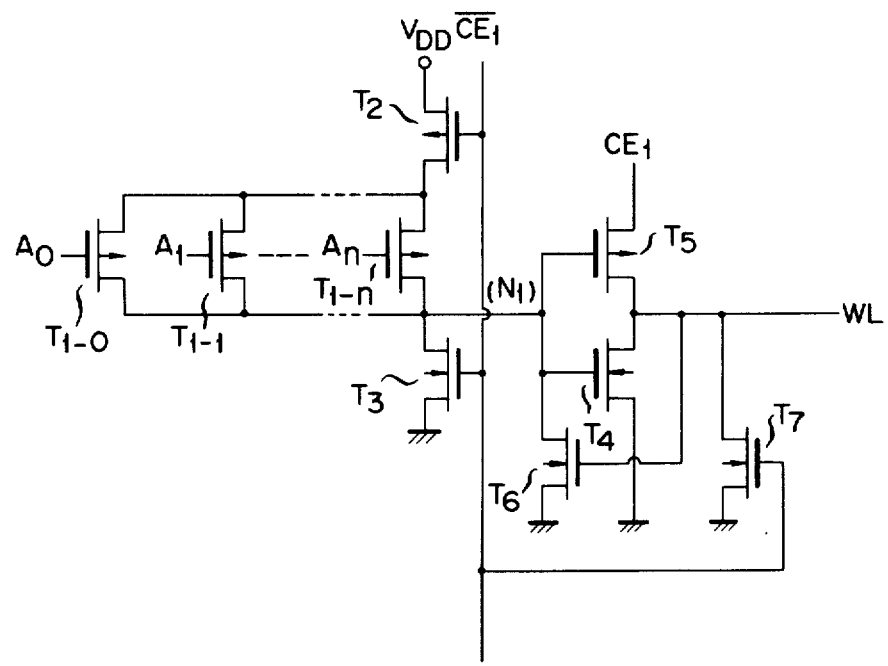
FIG. 1 is a circuit diagram showing a prior-art MOS decoder circuit.

An embodiment of the invention will now be described with reference to FIG. 2.

FIG. 2 shows decoder units $DU_1$ and $DU_2$ for two rows adjacent to each other. Since the individual decoder units have practically the same construction, the construction of the decoder unit $DU_1$ will first be described, and the construction of the decoder unit $DU_2$ will be described later only briefly.

In the decoder unit $DU_1$, N channel transistors $T_{11-0}, T_{11-1}, \ldots, T_{11-n}$ have their drains commonly connected and their sources also commonly connected, that is, the transistors $T_{11-0}, T_{11-1}, \ldots, T_{11-n}$ are connected parallel to one another. An address signal consisting of address bits $A_0, A_1, \ldots, A_n$ is coupled to the gates of the transistors $T_{11-0}, T_{11-1}, \ldots, T_{11-n}$. The address bits $A_0, A_1, \ldots, A_n$ constitute a single address signal which is to be decoded by the decoder unit $DU_1$.

The MOS transistors $T_{11-0}, T_{11-1}, \ldots, T_{11-n}$ have their commonly connected drains (node $N_{11}$) connected through a P channel MOS transistor $T_{12}$ which serves as a load resistor to a positive potential $V_{DD}$ and their commonly connected sources (node $N_{15}$) connected through an N channel MOS transistor $T_{13}$ to the ground potential.

An N channel MOS transistor $T_{14}$ has its drain connected to the source of a P channel MOS transistor $T_{15}$ whose drain is connected to the positive potential $V_{DD}$. The MOS transistors $T_{14}$ and $T_{15}$ constitute a MOS transistor circuit $TC_1$. The gates of the MOS transistors $T_{14}$ and $T_{15}$ constitute an input terminal of the circuit $TC_1$, and this input terminal is connected to the drains (node $N_{11}$) of the MOS transistors $T_{11-0}, T_{11-1}, \ldots, T_{11-n}$. The drain of the MOS transistor $T_{14}$ and drain of the MOS transistor $T_{15}$ constitute one output terminal (node $N_{13}$, first input terminal) of the circuit $TC_1$, and the source of the MOS transistor $T_{14}$ constitutes another output terminal (second output terminal). The output terminal (node $N_{13}$), i.e., first output terminal, is constituted by the drain of the MOS transistor $T_{14}$ and the drain of the MOS transistor $T_{15}$ in the MOS transistor circuit $TC_1$ and is connected through a MOS transistor $T_{16}$ which serves as a load resistor to the positive potential $V_{DD}$. The other output terminal i.e., second output terminal, is constituted by the source of the MOS transistor $T_{14}$ and is connected to the drains of N channel MOS transistors $T_{21\text{-}0}, T_{21\text{-}1}, \ldots, T_{21\text{-}n}$ is an adjacent row (to be described later).

A P channel MOS transistor $T_{17}$ and an N channel MOS transistor $T_{18}$ constitute a complementary MOS (CMOS) inverter $IV_1$. The inverter $IV_1$ has its input terminal (i.e., gates of the MOS transistors $T_{17}$ and $T_{18}$) connected to the aforementioned first output terminal (node $N_{13}$) of the MOS transistor circuit $TC_1$. The source of the MOS transistor $T_{17}$ and the drain of the MOS transistor $T_{18}$ are connected to each other and constitute an output terminal of the inverter $IV_1$. The output terminal of the inventer $IV_1$ is connected to a word line $WL_1$.

Described so far is the detailed construction of the decoder unit $DU_1$ in a row $R_1$. The construction of the decoder unit $DU_2$ in a row $R_2$ is practically the same as the unit $DU_1$ as mentioned earlier, so its detailed description is omitted, but only the correspondence of the elements constituting the individual decoder units $DU_1$ and $DU_2$ will be described here.

The parallel N channel MOS transistors $T_{21\text{-}0}, T_{21\text{-}1}, \ldots, T_{21\text{-}n}$ correspond to the respective MOS transistors $T_{11\text{-}0}, T_{11\text{-}1}, \ldots, T_{11\text{-}n}$, and a P channel MOS transistor $T_{22}$ corresponds to the P channel MOS transistor $T_{12}$. A MOS transistor circuit $TC_2$ corresponds to the circuit $TC_1$, and it is constituted by an N channel MOS transistor $T_{24}$ and a P channel MOS transistor $T_{25}$. The MOS transistors $T_{24}$ and $T_{25}$ correspond to the respective MOS transistors $T_{14}$ and $T_{15}$. A P channel MOS transistor $T_{26}$ corresponds to a MOS transistor $T_{16}$. An inverter $IV_2$ corresponds to the inverter $IV_1$, and it is constituted by a P channel MOS transistor $T_{27}$ and an N channel MOS transistor $T_{28}$. The MOS transistors $T_{27}$ and $T_{28}$ correspond to the respective MOS transistor $T_{17}$ and $T_{18}$. Nodes $N_{21}$ and $N_{22}$ correspond to the respective nodes $N_{11}$ and $N_{12}$. The inverter $IV_2$ has its output terminal connected to a word line $WL_2$.

An address signal consisting of address bits $(\overline{A_0}), (\overline{A_1}), \ldots, (\overline{A_n})$ is coupled to the gates of the MOS transistors $T_{21\text{-}0}, T_{21\text{-}1}, \ldots, T_{21\text{-}n}$. For example, the address bit $(\overline{A_0})$ means $A_0$ or $\overline{A_0}$. Similar definitions apply to bits $(\overline{A_1}), \ldots, (\overline{A_n})$.

While the correspondence of the components of the decoder units $DU_1$ and $DU_2$ are mentioned above, the connection of these components will now be described.

The commonly connected sources of the MOS transistors $T_{11\text{-}0}, T_{11\text{-}1}, \ldots, T_{11\text{-}n}$ are connected to the sources of the MOS transistors $T_{21\text{-}0}, T_{21\text{-}1}, \ldots, T_{21\text{-}n}$. The source of the transistor $T_{14}$ of the MOS transistor circuit $TC_1$ (i.e., the aforesaid second output terminal of the MOS transistor circuit $TC_1$) is connected to the gates of the MOS transistors $T_{24}$ and $T_{25}$ in the MOS transistor circuit $TC_2$ and also to the drains (node $N_{21}$) of the MOS transistors $T_{21\text{-}0}, T_{21\text{-}1}, \ldots, T_{21\text{-}n}$. The source of the MOS transistor $T_{24}$ in the MOS transistor circuit $TC_2$ is connected to the gates of the MOS transistors $T_{14}$ and $T_{15}$ in the MOS transistor circuit $TC_1$ and also to the drains (node $N_{11}$) of the MOS transistors $T_{11\text{-}0}, T_{11\text{-}1}, \ldots, T_{11\text{-}n}$.

The clock signal CE is commonly coupled to the MOS transistors $T_{12}, T_{13}, T_{16}, T_{22}$ and $T_{26}$.

The decoding operation for selecting a word line in the MOS decoder circuit of the construction shown in FIG. 2 will now be described.

The operation will first be described with reference to FIGS. 3A to 3I. Before the address signals consisting of the address bits $A_0, A_1, \ldots, A_n$ and those $(\overline{A_0}), (\overline{A_1}), \ldots, (\overline{A_n})$ are applied to the MOS transistors $T_{11\text{-}0}, T_{11\text{-}1}, \ldots, T_{11\text{-}n}$ and to $T_{21\text{-}0}, T_{21\text{-}1}, \ldots, T_{21\text{-}n}$, the clock signal CE is set to a "0" level (as shown in FIG. 3A) to set the nodes $N_{11}, N_{21}, N_{13}$ and $N_{23}$ to a "1" level (as shown in FIGS. 3B, 3C, 3D and 3E), thus setting the word lines $WL_1$ and $WL_2$ to a "0" level (as shown in FIGS. 3F and 3G). After the setting of this state, the address signals are applied to the transistors $T_{11\text{-}0}, T_{11\text{-}1}, \ldots, T_{11\text{-}n}$ and $T_{21\text{-}0}, T_{21\text{-}1}, \ldots, T_{21\text{-}n}$. Subsequently, the clock signal CE is inverted from "0" level to "1" level, whereupon the MOS transistors $T_{13}$ is turned on (as shown in FIG. 3H) to bring the node $N_{15}$ to a "0" level (as shown in FIG. 3I). The decoding operation that takes place in consequence will now be described.

(1) In the case when neither word line $WL_1$ nor $WL_2$ is selected (FIGS. 4A to 4I):

In this case, at least one of the address bits $A_0, A_1, \ldots, A_n$ and at least one of the address bits $(\overline{A_0}), (\overline{A_1}), \ldots, (\overline{A_n})$ are at "1" level. Thus, with the change of the clock signal CE from "0" level to "1" level (as shown in FIG. 4A), the nodes $N_{11}$ and $N_{21}$ are both brought to "0" level (as shown in FIGS. 4B and 4C), thus turning on both the P channel MOS transistors $T_{15}$ and $T_{25}$ in the respective MOS transistor circuits $TC_1$ and $TC_2$ (as shown in FIGS. 4d and 4E). Thus, the nodes $N_{13}$ and $N_{23}$ both remain at "1" level (as shown in FIGS. 4F and 4G), so that the word lines $WL_1$ and $WL_2$ are held at "0" level. This means that neither word line $WL_1$ nor $WL_2$ is selected.

(2) In the case when the word line $WL_1$ is selected (FIGS. 5A to 5H):

In this case, the address bits $A_0, A_1, \ldots, A_n$ are all at "0" level, while at least one of the address bits $(\overline{A_0}), (\overline{A_1}), \ldots, (\overline{A_n})$ is at "1" level. Thus, with the change of the clock signal CE from "0" level to "1" level (as shown in FIG. 5A), the node $N_{11}$ remains at "1" level (as shown in FIG. 5b), while the node $N_{21}$ is brought to "0" level (as shown in FIG. 5C). As a result, the MOS transistor $T_{14}$ is turned on (as shown in FIG. 5D) to bring the node $N_{13}$ to "0" level (as shown in FIG. 5E), so that the word line $WL_1$ is brought from "0" level to "1" level (as shown in FIG. 5G). This means that the word line $WL_1$ is selected. Meanwhile, the node $N_{23}$ remains at "1" level (as shown in FIg. 5F), so that the word line $WL_2$ is held at "0" level (as shown in FIG. 5H). This means that the word line $WL_2$ is not selected.

(3) In the case when the word line $WL_2$ is selected (FIGS. 6A to 6H):

In this case, the address bits $(\overline{A_0}), (\overline{A_1}), \ldots, (\overline{A_n})$ are all at "0" level, while at least one of the address bits $A_0, A_1, \ldots, A_n$ is at "1" level. Thus, with the change of the clock signal CE from "0" level to "1" level (as shown in FIG. 6A), the node $N_{21}$ remains at "1" level (as shown in FIG. 6C), while the node $N_{11}$ is brought to "0" level (as shown in FIG. 6B). As a result, the MOS transistor $T_{24}$ is turned on (as shown in FIG. 6D) to bring the node $N_{23}$ to "0" level (as shown in FIG. 6F), thus bringing the word line $WL_2$ to "1" level (as shown in FIG.

6H). This means that the word line WL$_2$ is selected. Meanwhile, the node N$_{13}$ remains at "1" level (as shown in FIG. 6E), so that the word line WL$_1$ is held at "0" level (as shown in FIG. 6G), that is, it is not selected.

As has been apparent from the above description of the operation, only a single clock signal is required for the operation unlike the prior-art MOS decoder circuit in which two signals are required. Thus, unlike the prior art the adjustment of the timing of pulse generation between the two clock signals is not required, so that it is possible to obtain a high speed operation. Further, the change speeds of the node N$_{21}$ from "1" level to "0" level and of the node N$_{13}$ from "1" level to "0" level in the aforementioned case (2), may be advanced by adopting bit patterns of the address signals as follows.

Of the address bits A$_0$, A$_1$, ..., A$_n$ in the address signal to the decoder unit DU$_1$, the bits A$_0$ to A$_{(n+1)/2}$, for instance, have the same binary values as those of the address bits $(\overline{A_0})$ to $(\overline{A_{(n+1)/2}})$ in the address signal to the decoder unit DU$_2$, while the remaining bits A$_{(n+1)/2+1}$ to A$_n$ in the former address signal have binary values complementary to those of the address bits $(\overline{A_{(n+1)/2+1}})$ to $(\overline{A_n})$ in the latter address signal. By so doing, the parallel MOS transistors, to which the address bits $(\overline{A_{(n+1)/2+1}})$ to $(\overline{A_n})$ are coupled, are all turned on so that it is possible to obtain a very short discharge time. In addition, the discharge time may be made equal for all the rows. Thus, it is possible to increase the speed of operation.

That is, preferably, exactly half of the address signal to the decoder unit DU$_1$ is formed of bits whose binary values are complementary to the bits forming the half of the address signal to the decoder unit DU$_2$. The reason is to prevent imbalance of the transition period of the change of the nodes N$_{11}$ and N$_{21}$ from "1" level to "0" level. Where the address signals to be supplied to the decoder units DU$_1$ and DU$_2$ each consist of an odd number of address bits, the number of bits of same binary value of address signals applied to the decoder units DU$_1$ and DU$_2$ in common is larger or smaller by one than that of the complementary binary value of said address signals applied to the decoder units DU$_1$ and DU$_2$.

Figure 7:
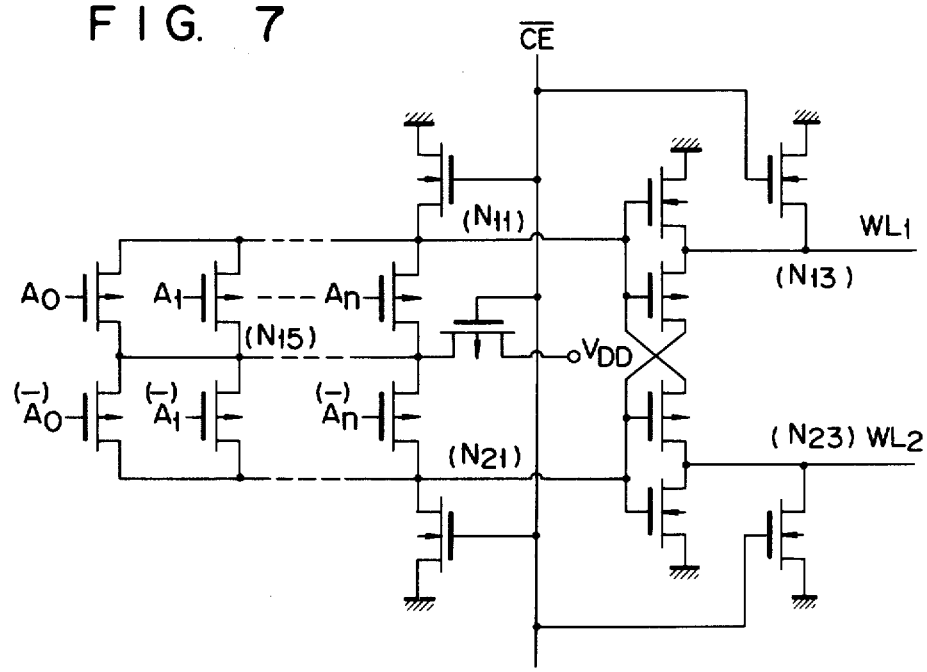
FIG. 7 is a circuit diagram showing another embodiment of the invention.

FIG. 7 shows a different embodiment of the invention. In this embodiment, the channel types of the MOS transistors and the levels of the potentials applied in the preceding embodiment of FIG. 2 are reversed. More particularly, in this embodiment the clock signal $\overline{CE}$ which is 180 degrees out of phase with the clock signal CE is used in lieu of the clock signal CE used in the preceding embodiment. Also, in this embodiment the levels of the potentials on the nodes N$_{11}$, N$_{12}$, N$_{13}$, N$_{14}$ and N$_{15}$ are reversed with respect to the case of the preceding embodiment. Thus, here the inverters in the preceding embodiment are unnecessary. The operation of this embodiment is practically the same as that of the preceding embodiment of FIG. 2 as described earlier, so it is not described any further. It is to be emphasized that similar effects to those in case of the embodiment of FIG. 2 are obtainable with this embodiment.

Figure 8:
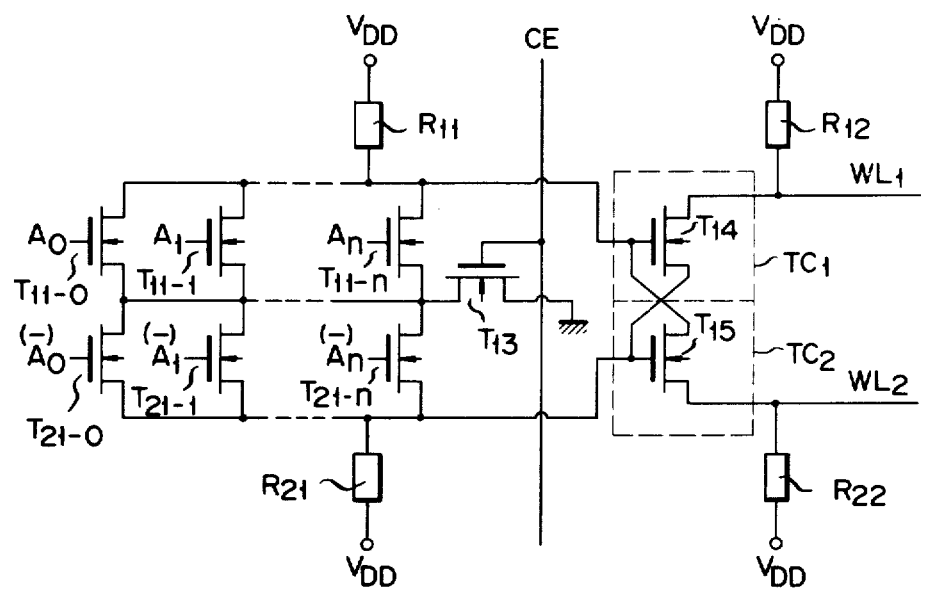
FIG. 8 is a circuit diagram showing a further embodiment of the invention.

FIG. 8 shows a further embodiment of the MOS decoder circuit according to the invention.

In this embodiment, load resistors R$_{11}$, R$_{12}$, R$_{21}$ and R$_{22}$, which may be constituted by a depletion type MOS FET whose gate is connected to its source, as shown in FIG. 9, or an enhancement type MOS FET whose gate is connected to its drain, as shown in FIG. 10, are used in lieu of the respective MOS transistors T$_{12}$, T$_{16}$, T$_{22}$ and T$_{26}$ controlled by the clock signal CE in the embodiment of FIG. 2. Also, in this embodiment a single N channel MOS transistor circuit TC$_1$ is used to replace the MOS transistor circuit TC$_1$ consisting of the two MOS transistors T$_{14}$ and T$_{15}$ in the embodiment of FIG. 2, and a single N channel MOS transistor T$_{24}$ is used to replace the MOS transistor circuit TC$_2$ consisting of the two MOS transistors T$_{24}$ and T$_{25}$.

In this embodiment, the gate of the MOS transistor T$_{14}$ constitutes an input terminal of the MOS transistor circuit TC$_1$, and the drain and source of this transistor constitute respective output terminals. Further, in this embodiment the gate of the MOS transistor T$_{24}$ constitutes an input terminal of the MOS transistor TC$_2$, and the drain and source of this transistor constitute respective output terminals.

In this embodiment, the inverters IV$_1$ and IV$_2$ in the embodiment of FIG. 2 are unnecessary. Also in this embodiment, only the MOS transistor T$_{13}$ is controlled by the clock pulse signal CE.

The operation of this embodiment will now be described. In the first place, a precharge operation will be described with respect to FIGS. 11A to 11G. The clock signal CE is set to a "0" level (as shown in FIG. 11A) to have the MOS transistor T$_{13}$ turned off (FIG. 11B). Thus, in this state the nodes N$_{11}$ and N$_{12}$ are at "1" level (as shown in FIGS. 11C and 11D), and the word lines WL$_1$ and WL$_2$ are also at "1" level (as shown in FIG. 11F and 11G).

In this state, an address signal consisting of address bits A$_0$, A$_1$, ..., A$_n$ and an address signal consisting of address bits $(\overline{A_0})$ $(\overline{A_1})$ ..., $(\overline{A_n})$ are applied respectively to the MOS transistors T$_{11-0}$, T$_{11-1}$, ..., Thd 11-n and to the MOS transistors T$_{21-0}$, T$_{21-1}$, ..., T$_{21-n}$, and subsequently the clock signal CE is changed to "1" level (as shown in FIG. 11A). With the change of the clock signal CE to the "1" level (FIG. 11A) the MOS transistor T$_{13}$ is turned on (as shown in FIG. 11B) to bring the node N$_{15}$ to a "0" level (as shown in FIG. 11E). As a result, the following selecting operation takes place.

(1) In the case when neither word line WL$_1$ nor WL$_2$ is selected (FIGS. 12A to 12G):

In this case, one of the address bits A$_0$, A$_1$, ..., A$_n$ and also one of the address bits $(\overline{A_0})$ $(\overline{A_1})$ ..., $(\overline{A_n})$ is at "1" level. Thus, with the change of the clock signal from "0" level to "1" level (as shown in FIG. 12A), the nodes N$_{11}$ and N$_{21}$ are both brought to "0" level (as shown in FIGS. 12B and 12C), thus turning off both the MOS transistors T$_{14}$ and T$_{24}$ (as shown in FIGS. 12D and 12E). Thus, the word lines WL$_1$ and WL$_2$ are both held at the "1" level, that is, neither of them is selected.

(2) In the case when the word line WL$_1$ is selected (FIGS. 13A to 13G):

In this case, the address bits A$_0$, A$_1$, ..., A$_n$ are all at "0", while one of the other address bits $(\overline{A_0})$ $(\overline{A_1})$ ..., $(\overline{A_n})$ is at "1" level. Thus, with the change of the clock signal CE from "0" level to "1" level (as shown in FIG. 13A), the node N$_{11}$ remains at "1" level (as shown in FIG. 13B), while the node N$_{21}$ is brought to "0" level (as shown in FIG. 13C). As a result, the MOS transistor T$_{14}$ is turned on (as shown in FIG. 13D) to bring the word line WL$_1$ to "0" level (as shown in FIG. 13F). This means that the word line WL$_1$ is selected. Meanwhile, the MOS transistor T$_{24}$ remains "off" (as shown in FIG. 13E), so that the word line WL$_2$ is held at "1" level (as shown in FIG. 13G). This means that the word line WL$_2$ is not selected.

(3) In the case when the word line $WL_2$ is selected (FIGS. 14A to 14G):

In this case, at least one of the address bits $A_0, A_1, \ldots, A_n$ is at "1" level, while the address bits $(\overline{A_0},) (\overline{A_1},) \ldots, (\overline{A_n})$ are all at "0" level. Thus, with the change of the clock signal CE from "0" level to "1" level (as shown in FIG. 14A), the node $N_{21}$ remains at "1" level (as shown in FIG. 14C). As a result, the MOS transistor $T_{24}$ is turned on (as shown in FIG. 14E) to bring the word line $WL_2$ to the "0" level (as shown in FIG. 14E). This means that the word line $WL_2$ is selected. Meanwhile, the node $N_{11}$ is changed to "0" level (as shown in FIG. 14B). Thus, the MOS transistor $T_{14}$ remains "off" (as shown in FIG. 14D), so that the word line $WL_1$ is held at "1" level (as shown in FIG. 14F). This means that the word line $WL_1$ is not selected.

In case the selection of the word line as it is brought to the "0" level is not preferable, the signal level may be inverted by providing an inverter stage on the output side of each of the MOS transistors $T_{14}$ and $T_{24}$ as in the previous embodiment of FIG. 2.

Figure 15:
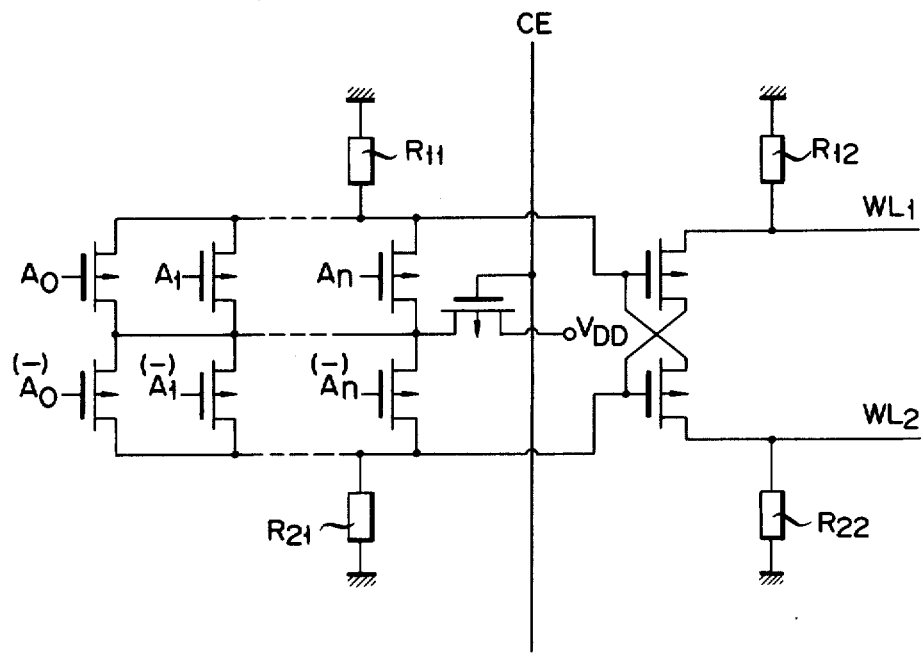
FIG. 15 is a circuit diagram showing a still further embodiment of the invention.

FIG. 15 shows a further embodiment of the invention. In this embodiment, the channel types of the MOS transistors and the levels of the potential in the embodiment of FIG. 8 applied are reversed. In this embodiment, the 180-degree out-of-phase clock signal $\overline{CE}$ is of course used in lieu of the clock signal CE.

With the embodiment of FIGS. 8 and 15, similar effects to those described earlier in connection with the embodiment of FIG. 2 may be obtained.

As has been described in the foregoing, according to the invention unlike the prior art in which two clock signal systems are required, only a single clock system is needed so that it is possible to provide a MOS decoder circuit used for a synchronous MOS memory device or the like, with which the cumbersome adjustment of the pulse generation timing between the two clock signals is unnecessary so which permits high speed operation.

What is claimed is:

1. An MOS decoder circuit for decoding an input signal, said circuit being coupled to a clock signal, a supply of a first voltage potential and a second voltage potential and comprising:

first MOS transistors of a first channel type arranged in rows or columns, said first MOS transistors being connected in parallel and receiving at their gates said input signal;

second MOS transistors of said first channel type arranged in rows or columns adjacent to said first MOS transistors, said second MOS transistors being connected in parallel, receiving at their gates said input signal and having their sources connected to the sources of said first MOS transistors;

a third MOS transistor of a second channel type connected between the drains of said first MOS transistors and said supply of said first voltage potential and receiving at its gate said clock signal;

a fourth MOS transistor of said first channel type connected between the sources of said first MOS transistors and said supply of said second voltage potential and receiving at its gate said clock signal;

fifth and sixth MOS transistors of said first and said second channel type, respectively, the gates of said fifth and sixth MOS transistors being connected together and to the drains of said first MOS transistors, the source of said fifth MOS transistor being connected to the drains of said second MOS transistors, the drains of said fifth and sixth MOS transistors being connected together, and the source of said sixth MOS transistor being connected to said supply of said first voltage potential; and a seventh MOS transistor of said second channel type connected between said drains of said fifth and sixth MOS transistors and said supply of said first voltage potential and receiving at its gate said clock signal.

2. A MOS decoder circuit according to claim 1, wherein said first and second channel types are respectively N and P channel types, and said first and second voltage potentials are respectively positive and ground potentials.

3. A MOS decoder circuit according to claim 1, wherein said first and second channel types are respectively P and N channel types, and said first and second voltage potentials are respectively ground and positive potentials.

* * * * *